(12) United States Patent
Miyashita

(10) Patent No.: US 7,623,839 B2
(45) Date of Patent: Nov. 24, 2009

(54) SEMICONDUCTOR INTEGRATED CIRCUIT

(75) Inventor: Daisuke Miyashita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 460 days.

(21) Appl. No.: 11/684,128

(22) Filed: Mar. 9, 2007

(65) Prior Publication Data

US 2007/0213026 A1  Sep. 13, 2007

(30) Foreign Application Priority Data

Mar. 10, 2006  (JP) ............................. 2006-065531

(51) Int. Cl.
*H04B 1/28* (2006.01)
*H04B 1/26* (2006.01)
(52) U.S. Cl. ................ 455/333; 455/326; 455/323
(58) Field of Classification Search .............. 455/323, 455/333, 313, 334, 341, 118, 326, 189.1, 455/190.1, 293; 257/690–692; 327/359, 327/113, 355
See application file for complete search history.

(56) References Cited

U.S. PATENT DOCUMENTS

| | | | |
|---|---|---|---|
| 5,859,559 A * | 1/1999 | Hong et al. .................. | 327/359 |
| 6,388,502 B2 * | 5/2002 | Kaneki et al. ................ | 327/359 |
| 6,552,586 B2 | 4/2003 | Grasset et al. | |
| 6,847,108 B2 * | 1/2005 | Takikawa et al. ............. | 257/692 |
| 7,050,779 B2 * | 5/2006 | Ono et al. .................... | 455/333 |
| 7,298,600 B2 * | 11/2007 | Takikawa et al. .............. | 361/56 |
| 7,369,817 B2 * | 5/2008 | Takikawa et al. .............. | 455/73 |

FOREIGN PATENT DOCUMENTS

| | | |
|---|---|---|
| JP | 2004-357091 | 12/2004 |
| JP | 2005-184141 | 7/2005 |

* cited by examiner

*Primary Examiner*—Sonny Trinh
(74) *Attorney, Agent, or Firm*—Oblon, Spivak, McClelland, Maier & Neustadt, L.L.P.

(57) ABSTRACT

A semiconductor integrated circuit including: a mixer circuit which includes a first MOS transistor a second MOS transistor; a third MOS transistor whose drain is connected to a first potential, and which has a conductivity type and a threshold value which are the same as those of the first MOS transistor and the second MOS transistor; a current source connected between the source of the third MOS transistor and a second potential; a voltage dividing circuit which is connected between the first potential and the second potential, and divides a voltage between the first potential and the second potential to output a divided voltage as a reference voltage; and a differential amplifier circuit whose in-phase input receives the reference voltage, whose anti-phase input receives a source potential of the third MOS transistor, and whose output is connected to a gate of the third MOS transistor.

16 Claims, 2 Drawing Sheets

SEMICONDUCTOR INTEGRATED CIRCUIT

CROSS-REFERENCE TO RELATED APPLICATIONS

This application is based upon and claims the benefit of priority from the prior Japanese Patent Application No. 2006-65531, filed on Mar. 10, 2006, the entire contents of which are incorporated herein by reference.

BACKGROUND OF THE INVENTION

1. Field of the Invention

The present invention relates to a mixer circuit used, for example, for an LSI (Large Scale Integrated circuit) for radio communication.

2. Background Art

Conventionally, there has been used a mixer circuit which performs frequency conversion of radio frequency (RF) signals in radio communication.

The mixer circuit includes an active mixer of a type that receives an input signal as a current and switches current paths by turning on and off an MOS switch, into which a local oscillation (LO) signal is inputted By the switching of current paths, current signals having frequencies of the sum and difference of the frequency of the input voltage signal and the frequency of the LO signal are outputted to an output terminal.

In this active mixer, when a steady state current flows to the above described MOS switch constituting the mixer circuit, a flicker noise proportional to 1/frequency is generated.

Particularly, in the case where the mixer circuit is a down conversion mixer which is used for a direct conversion mode receiver or a Low-IF (intermediate frequency) mode receiver, this flicker noise becomes a problem.

In order to solve this problem, a passive mixer in which the steady state current is not permitted to flow is adopted as the mixer circuit. Generally, in the passive mixer, for example, a suitable potential obtained by dividing a power supply voltage with the use of a common mode feedback technique, is given as the source potential and the drain potential of the MOS switch, respectively. Furthermore, the gate potential of the MOS switch is set, for example, to the other potential obtained by dividing the power supply voltage by resistors.

However, the passive mixer generally needs a local oscillation signal having a large amplitude in order to obtain a sufficient conversion gain, which results in an increase in current consumption.

Furthermore, in the case where the bias potential of the above described MOS switch is set to a fixed potential generated by dividing the power supply voltage by resistors, as described above, when a threshold voltage is lowered due to process variation, temperature variation and power supply voltage variation, the above described MOS switch is brought into on-state in a steady state so as to permit a steady state current to flow, as a result of which the flicker noise is generated. Therefore, even when the passive mixer is adopted, the noise characteristic is deteriorated due to process variation, temperature variation, and power supply voltage variation.

Here, the conventional mixer circuit includes, for example, a mixer circuit having a bias circuit for supplying a bias voltage applied to the gate of an MOS switch, into which an IF signal is inputted This bias circuit outputs the bias voltage by using a differential amplifier on the basis of a voltage at which the MOS transistor as a component operates in a pentode region (see, for example, Japanese Patent Laid-Open Publication No. 2005-184141).

The above described conventional semiconductor integrated circuit, as described above, controls the gate voltage of the MOS switch into which the IF signal is inputted, and does not control the gate voltage of the MOS switch into which the local oscillation signal is inputted.

Furthermore, in the above described conventional semiconductor integrated circuit, the voltage applied to the source and the drain of the MOS switch into which the local oscillation signal is inputted, is not referred to. Thus, even when the bias voltage is controlled by the above described bias circuit, the threshold value of the MOS switch varies due to process variation, temperature variation, and power supply voltage variation.

That is, even with the above described conventional semiconductor integrated circuit, there is a problem that the flicker noise as described above may be generated due to process variation, temperature variation, and power supply voltage variation, to thereby cause the noise characteristic to be deteriorated, while increasing the conversion gain of a mixer circuit.

SUMMARY OF THE INVENTION

According one aspect of the present invention, there is provided: a semiconductor integrated circuit comprising a mixer circuit which includes a first MOS transistor whose source is connected to a first terminal receiving a first current signal formed by voltage-current converting a radio frequency signal, whose gate receives a first local oscillation signal via a first capacitance, and whose drain is connected to a second terminal which outputs a second current signal with the first local oscillation signal superimposed thereon, and a second MOS transistor whose source is connected to the first terminal, whose gate receives, via a second capacitance, a second local oscillation signal which is an inverted signal of the first local oscillation signal, and whose drain is connected to a third terminal which outputs a third current signal with the second local oscillation signal superimposed thereon; a third MOS transistor whose drain is connected to a first potential, and which has a conductivity type and a threshold value which are the same as those of the first MOS transistor and the second MOS transistor; a current source connected between the source of the third MOS transistor and a second potential; a voltage dividing circuit which is connected between the first potential and the second potential, and divides a voltage between the first potential and the second potential to output the divided voltage as a reference voltage; and a differential amplifier circuit whose in-phase input receives the reference voltage, whose anti-phase input receives the source potential of the third MOS transistor, and whose output is connected to the gate of the third MOS transistor, wherein the output voltage of the differential amplifier circuit is applied to the gate of the first MOS transistor via a first resistor, and to the gate of the second MOS transistor via a second resistor, and wherein DC voltages of the drain and the source of the first and second MOS transistors are controlled to be equal to the reference voltage.

DETAILED DESCRIPTION

A semiconductor integrated circuit according to an embodiment of the present invention is capable of suppressing deterioration of the conversion gain and the noise characteristic of a mixer circuit due to process variation, temperature variation, and power supply voltage variation, by biasing a switch transistor of the mixer circuit to an on/off boundary state.

In the following, respective embodiments according to the present invention will be described with reference to the accompanying drawings.

It should be noted that in the respective embodiments as will be described below, a case where an n-type MOS transistor is used for the MOS transistor will be explained, but a p-type MOS transistor may also be used by reversing the polarity of the circuit.

First Embodiment

Figure 1:
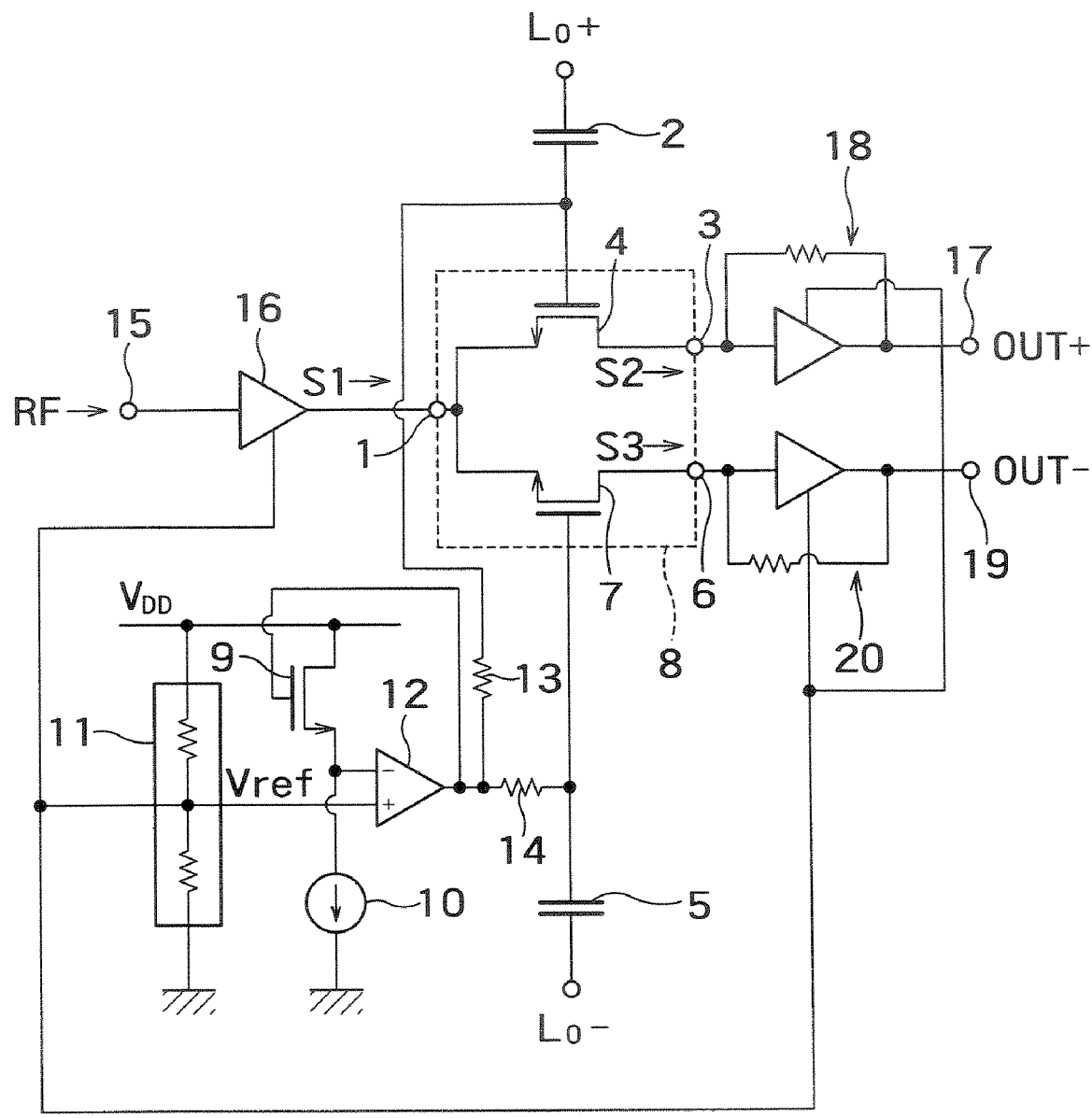
FIG. 1 is a circuit diagram showing a main part configuration of a semiconductor integrated circuit 100 according to a first Embodiment which is an aspect of the present invention.

FIG. 1 is a circuit diagram showing a main part configuration of a semiconductor integrated circuit 100 according to a first Embodiment which is an aspect of the present invention.

As shown in FIG. 1, a semiconductor integrated circuit 100 is provided with a mixer circuit 8 which includes: a first MOS transistor 4 whose source is connected to a first terminal 1 receiving a first current signal S1 formed by voltage-current converting an RF signal, whose gate receives a first local oscillation signal LO+ via a first capacitance 2, and whose drain is connected to a second terminal 3 which outputs a second current signal S2 with the first local oscillation signal LO+ superimposed thereon; and a second MOS transistor 7 whose source is connected to the first terminal 1, whose gate receives a second local oscillation signal LO− which is an inverted signal of the first local oscillation signal LO+ via a second capacitance 5, and whose drain is connected to a third terminal 6 which outputs a third current signal S3 with the second local oscillation signal LO− superimposed thereon.

The second MOS transistor 7 is an n-type MOS transistor of the same conductivity type as the first MOS transistor 4.

In accordance with the inputs of the first and second local oscillation signals LO+ and LO−, the mixer circuit 8 switches the path of the inputted first current signal SL at the frequency of the local oscillation signal by alternately turning on and off the first and second MOS transistors 4 and 7.

Thereby, the second and third current signals S2 and S3, which respectively have frequencies of the sum and difference of the frequency of the RF signal and the frequency of the local oscillation signal, are outputted to the second and third terminals 3 and 6, respectively.

Furthermore, the semiconductor integrated circuit 100 is provided with a third MOS transistor 9 whose drain is connected to a power supply potential $V_{DD}$ which is a first potential, and whose conductivity type (n-type) and threshold value are the same as those of the first MOS transistor 4 and the second MOS transistor 7, and with a current source 10 connected between the source of the third MOS transistor 9 and the ground potential which is a second potential.

The third MOS transistor 9 is formed in the same semiconductor substrate as the first and second MOS transistors 4 and 7 under the same manufacturing conditions, that is, in processes which are simultaneously performed. This makes it possible for the first, second and third MOS transistors 4, 7 and 9 to have the same size and to be set to have an equal threshold value. Furthermore, since the respective MOS transistors are formed in the same semiconductor substrate under the same manufacturing conditions and in the processes simultaneously performed, the influence of process variation on the threshold value can be reduced.

Here, the current source 10 is a constant current source which outputs a small constant current. Thereby, the third MOS transistor 9 constitutes a source follower circuit biased by the small constant current. Therefore, a DC voltage Vgs between the gate and the source of the third MOS transistor 9 is made approximately equal to the threshold voltage Vth of the third MOS transistor 9.

Furthermore, the semiconductor integrated circuit 100 is provided with a voltage dividing circuit 11 which is connected between the power supply potential $V_{DD}$ and the ground potential, and divides the voltage between the power supply potential $V_{DD}$ and the ground potential so as to output the divided voltage as a reference voltage Vref, and with a differential amplifier circuit 12 whose in-phase input receives the reference voltage Vref, whose anti-phase input receives the source potential of the third MOS transistor 9, and whose output is connected to the gate of the third MOS transistor.

The reference voltage Vref outputted from the voltage dividing circuit 11 is set, for example, to a voltage $V_{DD}/2$ which is in the middle of the power supply potential $V_{DD}$ and the ground potential.

The differential amplifier circuit 12, the third MOS transistor 9, the current source 10, and the voltage dividing circuit 11 constitute a feedback loop. Thereby, the in-phase input potential (reference voltage Vref) and the anti-phase input potential of the differential amplifier circuit 12 are controlled so as to be equal to each other. Therefore, the differential amplifier circuit 12 outputs an output voltage of the sum of the reference voltage Vref and the threshold voltage Vth of the third MOS transistor 9.

This output voltage of the differential amplifier circuit 12 is applied to the gate of the first MOS transistor 4 via a first resistor 13, and to the gate of the second MOS transistor 7 via a second resistor 14.

Furthermore, the semiconductor integrated circuit 100 is provided with a voltage-current conversion circuit 16 which is connected between an RF signal input terminal 15 for receiving an RF signal and the first terminal 1, and voltage-current converts the RF signal so as to output the first current signal S1.

Furthermore, the semiconductor integrated circuit 100 is provided with a first current-voltage conversion circuit 18 which is connected between the second terminal 3 and a first IF signal output terminal 17 for outputting a first IF signal OUT+, and current-voltage converts the second current signal S2 to output the first IF signal OUT+, and with a second current-voltage conversion circuit 20 which is connected between the third terminal 6 and a second IF signal output terminal 19 for outputting a second IF signal OUT−, and current-voltage converts the third current signal S3 to output the second IF signal OUT−.

In accordance with the reference voltage Vref outputted by the voltage dividing circuit 11, the voltage-current conversion circuit 16 controls DC voltages of the source of the first and second MOS transistors 4 and 7 to be equal to the reference voltage Vref.

In accordance with the reference voltage Vref outputted by the voltage dividing circuit 11, the first current-voltage conversion circuit 18 controls DC voltage of the drain of the first MOS transistor 4 to be equal to the reference voltage Vref.

In accordance with the reference voltage Vref outputted by the voltage dividing circuit 11, the second current-voltage conversion circuit 20 controls DC voltage of the drain of the second MOS transistor 7 to be equal to the reference voltage Vref.

In this way, DC voltages of the source and the drain of the first and second MOS transistors 4 and 7 are controlled to be equal to the reference voltage Vref.

It should be noted that DC voltages of the source and the drain of the first and second MOS transistors 4 and 7 are controlled to be equal to the reference voltage Vref by other circuit configurations.

With the above described configuration, DC voltages of the gate of the first and second MOS transistors 4 and 7 become a voltage which is the sum of the threshold voltage Vth and the reference voltage Vref, and DC voltages of the source and the drain of the first and second MOS transistors 4 and 7 become the reference voltage Vref. Therefore, the state where the DC voltage Vgs between the gate and the source of the first and second MOS transistors 4 and 7 is equal to the threshold voltage Vth, is maintained without being affected by process variation, temperature variation, and power supply voltage variation.

Thereby, the DC voltage Vgs between the gate and the source of the first and second MOS transistors 4 and 7 is maintained at a desired value, and hence, it is not necessary to use a local oscillation signal having an unnecessarily large amplitude in order to obtain a desired conversion gain. That is, a desired conversion gain can be obtained with a local oscillation signal having a comparatively small amplitude.

Furthermore, the DC voltage Vgs between the gate and the source of the first and second MOS transistors 4 and 7 is maintained at the desired value, which makes it possible to prevent the flowing of the steady state current as in the prior art, and to thereby suppress the generation of the flicker noise, that is, the lowering of the noise characteristic.

As described above, with the semiconductor integrated circuit according to the present embodiment, it is possible to suppress the lowering of the conversion gain and the noise characteristic of the mixer circuit caused by process variation, temperature variation and power supply voltage variation.

Second Embodiment

In the First Embodiment, a configuration is described in detail, in which the current source is a constant current source, and the voltage between the gate and the source of the first and second MOS transistors are made equal to the threshold voltage.

In the present embodiment, a configuration is described, in which a variable current source is selected as the current source so as to make it possible to control the voltage applied to the gate of the MOS transistors constituting the mixer circuit.

Figure 2:
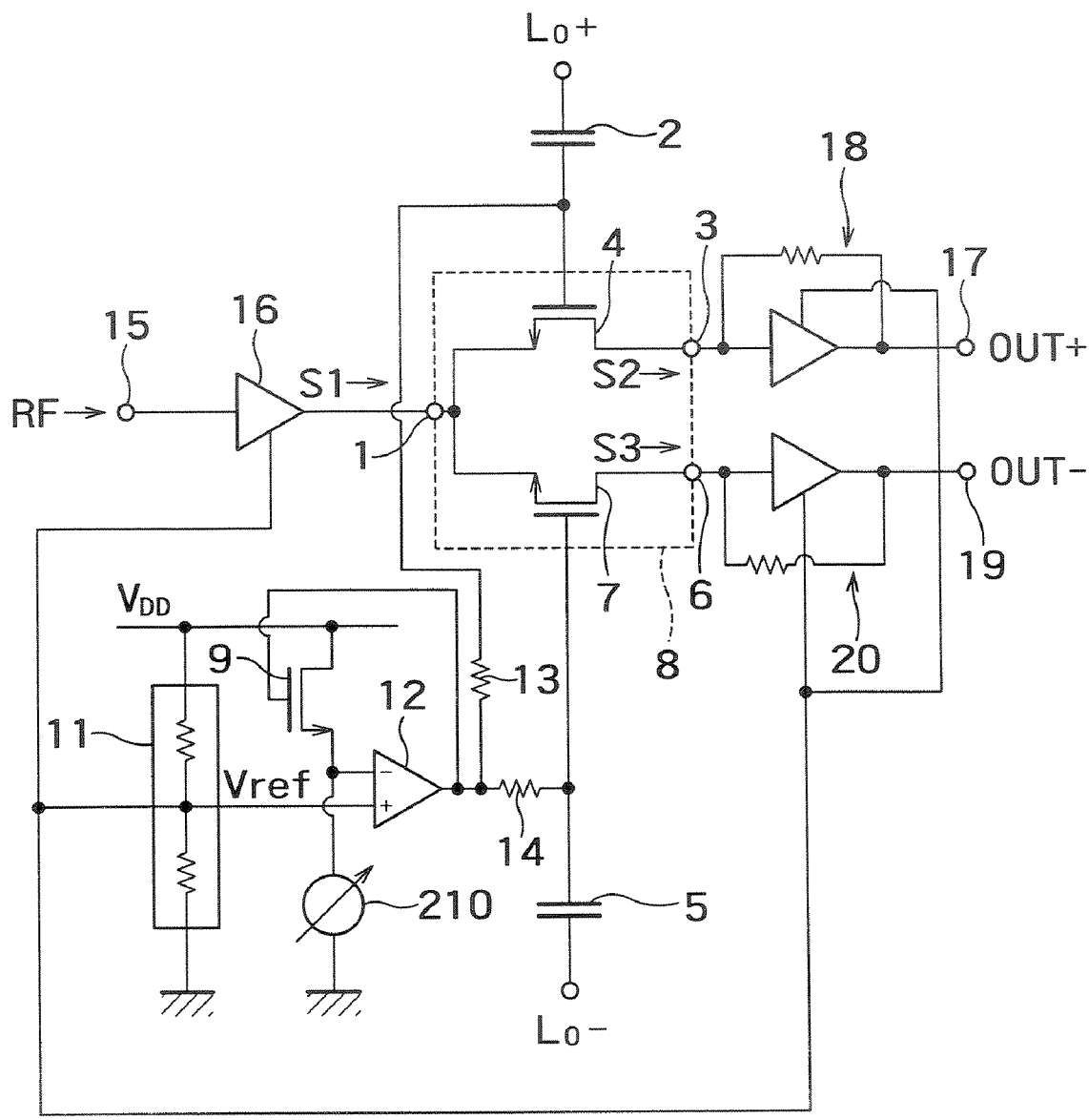
FIG. 2 is a circuit diagram showing a main part configuration of a semiconductor integrated circuit 200 according to a second Embodiment which is another aspect of the present invention.

FIG. 2 is a circuit diagram showing a main part configuration of a semiconductor integrated circuit 200 according to a second Embodiment which is an aspect of the present invention. It should be noted that in the figure, the same reference numerals and characters as those in the First Embodiment denote the same components as those in the First Embodiment.

As shown in FIG. 2, the semiconductor integrated circuit 200 is provided with a current source 210 connected between the source of the third MOS transistor 9 and the ground potential which is the second potential.

The current source 210 is a variable current source which is capable of controlling the bias current I flowing through the third MOS transistor 9. For example, when the bias current I is made to increase from the vicinity of 0 A, the output voltage outputted from the differential amplifier circuit 12 is increased from the value of the sum of the reference voltage Vref and the threshold voltage Vth. Thereby, the voltage applied to the gate of the first and second MOS transistors 4 and 7 is increased (+a) from the value of the sum of the reference voltage Vref and the threshold voltage Vth. Thus, the DC voltage Vgs between the gate and the source of the first and second MOS transistors 4 and 7 is increased (+a) from the value of the sum of the reference voltage Vref and the threshold voltage Vth.

In this way, the DC voltage Vgs between the gate and the source of the first and second MOS transistors 4 and 7 can be made to increase by controlling the current I with the variable current source 210.

Here, the conversion gain can be raised by increasing the DC voltage Vgs between the gate and the source, but this causes the noise characteristic to be deteriorated. On the other hand, the conversion gain is lowered by reducing the DC voltage Vgs between the gate and the source, but this enables the noise characteristic to be improved.

In this way, there is a trade-off relation between the conversion gain and the noise characteristic, and hence, it is possible to adjust the characteristics by controlling the bias current I of the third MOS transistor 9 in accordance with the performance required of the semiconductor integrated circuit 200.

As described above, with the semiconductor integrated circuit according to the present embodiment, similarly to the First Embodiment, it is possible to suppress the lowering of the conversion gain and the noise characteristic of the mixer circuit, which are caused by process variation, temperature variation, and power supply voltage variation.

Furthermore, it is possible to adjust the characteristics of the semiconductor integrated circuit by controlling the bias current I of the third MOS transistor.

What is claimed is:

1. A semiconductor integrated circuit comprising:
    a mixer circuit which includes a first MOS transistor whose source is connected to a first terminal receiving a first current signal formed by voltage-current converting a radio frequency signal, whose gate receives a first local oscillation signal via a first capacitance, and whose drain is connected to a second terminal which outputs a second current signal with the first local oscillation signal superimposed thereon, and a second MOS transistor whose source is connected to the first terminal, whose gate receives, via a second capacitance, a second local oscillation signal which is an inverted signal of the first local oscillation signal, and whose drain is connected to a third terminal which outputs a third current signal with the second local oscillation signal superimposed thereon;
    a third MOS transistor whose drain is connected to a first potential, and which has a conductivity type and a threshold value which are the same as those of the first MOS transistor and the second MOS transistor;
    a current source connected between the source of the third MOS transistor and a second potential;
    a voltage dividing circuit which is connected between the first potential and the second potential, and divides a voltage between the first potential and the second potential to output the divided voltage as a reference voltage; and
    a differential amplifier circuit whose in-phase input receives the reference voltage, whose anti-phase input receives the source potential of the third MOS transistor, and whose output is connected to the gate of the third MOS transistor,
    wherein the output voltage of the differential amplifier circuit is applied to the gate of the first MOS transistor via a first resistor, and to the gate of the second MOS transistor via a second resistor, and wherein DC voltages of the drain and the source of the first and second MOS transistors are controlled to be equal to the reference voltage.

2. The semiconductor integrated circuit according to claim 1, further comprising:

a voltage-current conversion circuit which is connected between a radio frequency signal input terminal receiving the radio frequency signal and the first terminal, and which voltage-current converts the radio frequency signal and outputs the first current signal;

a first current-voltage conversion circuit which is connected between the second terminal and a first intermediate frequency signal output terminal for outputting a first intermediate frequency signal, and which current-voltage converts the second current signal and outputs the first intermediate frequency signal; and a second current-voltage conversion circuit which is connected between the third terminal and a second intermediate frequency signal output terminal for outputting a second intermediate frequency signal, and which current-voltage converts the third current signal and outputs the second intermediate frequency signal, wherein in accordance with the reference voltage outputted by the voltage dividing circuit, DC voltages of the source of the first and second MOS transistors are controlled to be equal to the reference voltage by the voltage-current conversion circuit, wherein in accordance with the reference voltage outputted by the voltage dividing circuit, DC voltage of the drain of the first MOS transistor is controlled to be equal to the reference voltage by the first current-voltage conversion circuit, and wherein in accordance with the reference voltage outputted by the voltage dividing circuit, DC voltage of the drain of the second MOS transistor is controlled to be equal to the reference voltage by the second current-voltage conversion circuit.

3. The semiconductor integrated circuit according to claim 2, wherein the current source is a variable current source.

4. The semiconductor integrated circuit according to claim 3, wherein the first, second and third MOS transistors are formed under same manufacturing conditions.

5. The semiconductor integrated circuit according to claim 4, wherein the reference voltage is a voltage which is in the middle between the first potential and the second potential.

6. The semiconductor integrated circuit according to claim 3, wherein the reference voltage is a voltage which is in the middle between the first potential and the second potential.

7. The semiconductor integrated circuit according to claim 2, wherein the first, second and third MOS transistors are formed under same manufacturing conditions.

8. The semiconductor integrated circuit according to claim 7, wherein the reference voltage is a voltage which is in the middle between the first potential and the second potential.

9. The semiconductor integrated circuit according to claim 2, wherein the reference voltage is a voltage which is in the middle between the first potential and the second potential.

10. The semiconductor integrated circuit according to claim 1, wherein the current source is a variable current source.

11. The semiconductor integrated circuit according to claim 10, wherein the first, second and third MOS transistors are formed under same manufacturing conditions.

12. The semiconductor integrated circuit according to claim 11, wherein the reference voltage is a voltage which is in the middle between the first potential and the second potential.

13. The semiconductor integrated circuit according to claim 10, wherein the reference voltage is a voltage which is in the middle between the first potential and the second potential.

14. The semiconductor integrated circuit according to claim 1, wherein the first, second and third MOS transistors are formed under same manufacturing conditions.

15. The semiconductor integrated circuit according to claim 14, wherein the reference voltage is a voltage which is in the middle between the first potential and the second potential.

16. The semiconductor integrated circuit according to claim 1, wherein the reference voltage is a voltage which is in the middle between the first potential and the second potential.

* * * * *